(12) United States Patent
Cadigan et al.

(10) Patent No.: US 10,896,081 B2
(45) Date of Patent: Jan. 19, 2021

(54) IMPLEMENTING SEU DETECTION METHOD AND CIRCUIT

(71) Applicant: International Business Machines Corporation, Armonk, NY (US)

(72) Inventors: David D. Cadigan, Fairfield, NY (US); William V. Huott, Holmes, NY (US); Anuwat Saetow, Austin, TX (US); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 16/219,252

(22) Filed: Dec. 13, 2018

(65) Prior Publication Data
US 2020/0192739 A1 Jun. 18, 2020

(51) Int. Cl.
*G06F 11/00* (2006.01)
*G06F 11/07* (2006.01)

(52) U.S. Cl.
CPC ...... *G06F 11/0751* (2013.01); *G06F 11/0793* (2013.01)

(58) Field of Classification Search
CPC .................. G06F 11/0751; G06F 11/0793
See application file for complete search history.

(56) References Cited

U.S. PATENT DOCUMENTS

| | | | |
|---|---|---|---|
| 6,327,176 B1 | 12/2001 | Li et al. | |
| 6,696,873 B2 | 2/2004 | Hazucha et al. | |
| 7,028,290 B2* | 4/2006 | Srivastava | G06F 11/3676 712/227 |
| 7,188,284 B2 | 3/2007 | Mitra et al. | |
| 7,197,670 B2* | 3/2007 | Boatright | G06F 11/073 714/42 |
| 7,278,076 B2 | 10/2007 | Zhang et al. | |
| 7,434,123 B2 | 10/2008 | Ramos et al. | |
| 7,987,332 B2* | 7/2011 | Traister | G11C 16/10 711/167 |
| 8,020,039 B2* | 9/2011 | Reid | G06F 11/0757 714/10 |

(Continued)

FOREIGN PATENT DOCUMENTS

EP 2437172 B1 8/2013

OTHER PUBLICATIONS

Wen Yueh, "An Efficient Architecture for Detection of Multiple Bit Upsets in Processor Register Files", Thesis Rutgers, May 2009, New Brunswick https://rucore.libraries.rutgers.edu/rutgers-lib/25968/pdf/1/.

*Primary Examiner* — Esaw T Abraham
(74) *Attorney, Agent, or Firm* — Daniel M. Yeates

(57) ABSTRACT

A method and a circuit for implementing single event upset (SEU) parity detection, and a design structure on which the subject circuit resides are provided. The circuit implements detection of unwanted state changes due to SEUs, noise or other event in a latch having a default state of zero. The latch includes an L1 latch and an L2 latch with the L2 latch having the connected output and is used and monitored for a flip. A pair of series-connected field effect transistors (FETs) is connected between a drive input of a parity control circuit and ground potential. An inverted output of the L1 latch and a true output of the L2 latch is applied to a respective gate of the pair of series-connected FETs.

20 Claims, 2 Drawing Sheets

(56) References Cited

U.S. PATENT DOCUMENTS

| | | | |
|---|---|---|---|
| 8,161,367 B2 * | 4/2012 | Chandra | H03K 19/00392 |
| | | | 326/9 |
| 8,589,759 B2 | 10/2013 | Cox et al. | |
| 8,922,242 B1 | 12/2014 | Tseng et al. | |
| 9,292,378 B2 | 3/2016 | Wallner et al. | |
| 9,612,900 B2 | 4/2017 | Anderson et al. | |
| 10,095,570 B2 * | 10/2018 | Toba | H03K 19/1776 |
| 10,248,484 B2 * | 4/2019 | Hutton | G06F 11/1048 |
| 10,391,812 B2 * | 8/2019 | Stuck | B60B 7/10 |
| 10,528,413 B2 * | 1/2020 | Tan | G06F 30/30 |
| 2017/0075760 A1 | 3/2017 | Ozer et al. | |

\* cited by examiner

IMPLEMENTING SEU DETECTION METHOD AND CIRCUIT

FIELD OF THE INVENTION

The present invention relates generally to the data processing field, and more particularly, relates to a method and a circuit for implementing single event upset (SEU) parity detection, and a design structure on which the subject circuit resides.

DESCRIPTION OF THE RELATED ART

Cosmic ray induced terrestrial neutrons can flip values stored in static random-access memory (SRAM) cells, flip-flops and latches commonly used in semiconductor chips. Cosmic ray induced terrestrial neutrons can cause single event upsets (SEUs) in logic circuitry, also known as glitches.

These energetic particles can cause chip failure, modify stored data, change in functional logic operation, and the like. This is a serious concern for the semiconductor industry and applications which require high reliability, such as military, banking, government agencies, medical, and others.

Extensive engineering at substantial expense is applied to minimize susceptibility to energetic particle driven upsets. Dedicated circuits to manage single event upset (SEU), also referred to as soft errors (SERs), affect chip area, cost, and reliability for customers.

SUMMARY OF THE INVENTION

Principal aspects of the present invention are to provide a method and a circuit for single event upset (SEU) parity detection, and a design structure on which the subject circuit resides. Other important aspects of the present invention are to provide such method and circuit substantially without negative effects and that overcome some disadvantages of prior art arrangements.

In brief, a method and a circuit for implementing single event upset (SEU) parity detection, and a design structure on which the subject circuit resides are provided. The circuit implements detection of unwanted state changes due to SEUs, noise or other event in a latch having a default state of zero. The latch includes an L1 latch and an L2 latch with the L2 latch having the connected output and is used and monitored for a flip. A pair of series-connected field effect transistors (FETs) is connected between a drive input of a parity control circuit and ground potential. An inverted output of the L1 latch and a true output of the L2 latch is applied to a respective gate of the pair of series-connected FETs.

In accordance with features of the invention, the pair of series-connected field effect transistors (FETs) are N-channel NFETs, and the parity control circuit includes a P-channel PFET-based parity control circuit.

In accordance with features of the invention, the circuit includes a plurality of L1 L2 latches connected in a chain, each including a pair of series-connected field effect transistors (FETs). An L2 clock (L2 CLK) parity trigger circuit are shared across each of the plurality of L1 L2 latches. An L1 Data and Scan clock are shared across each of the plurality of L1 L2 latches. An L2 flip from a SEU relative to the L1 state is detected by the resultant bias state of the NFET group and compared to an initial parity input. On a mis-compare a parity failure is driven through parity out.

In accordance with features of the invention, L1 Data can flip via SEU, with a periodically scrub provided to scrub the error out.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized, and structural changes may be made without departing from the scope of the invention.

The terminology used herein is for the purpose of describing embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a circuit for implementing single event upset (SEU) parity detection, and a design structure on which the subject circuit resides are provided. The circuit includes a simplified parity detection circuit which is used to detect unwanted state changes in a default-0 latch design due to SEUs, noise or another event.

Figure 1:
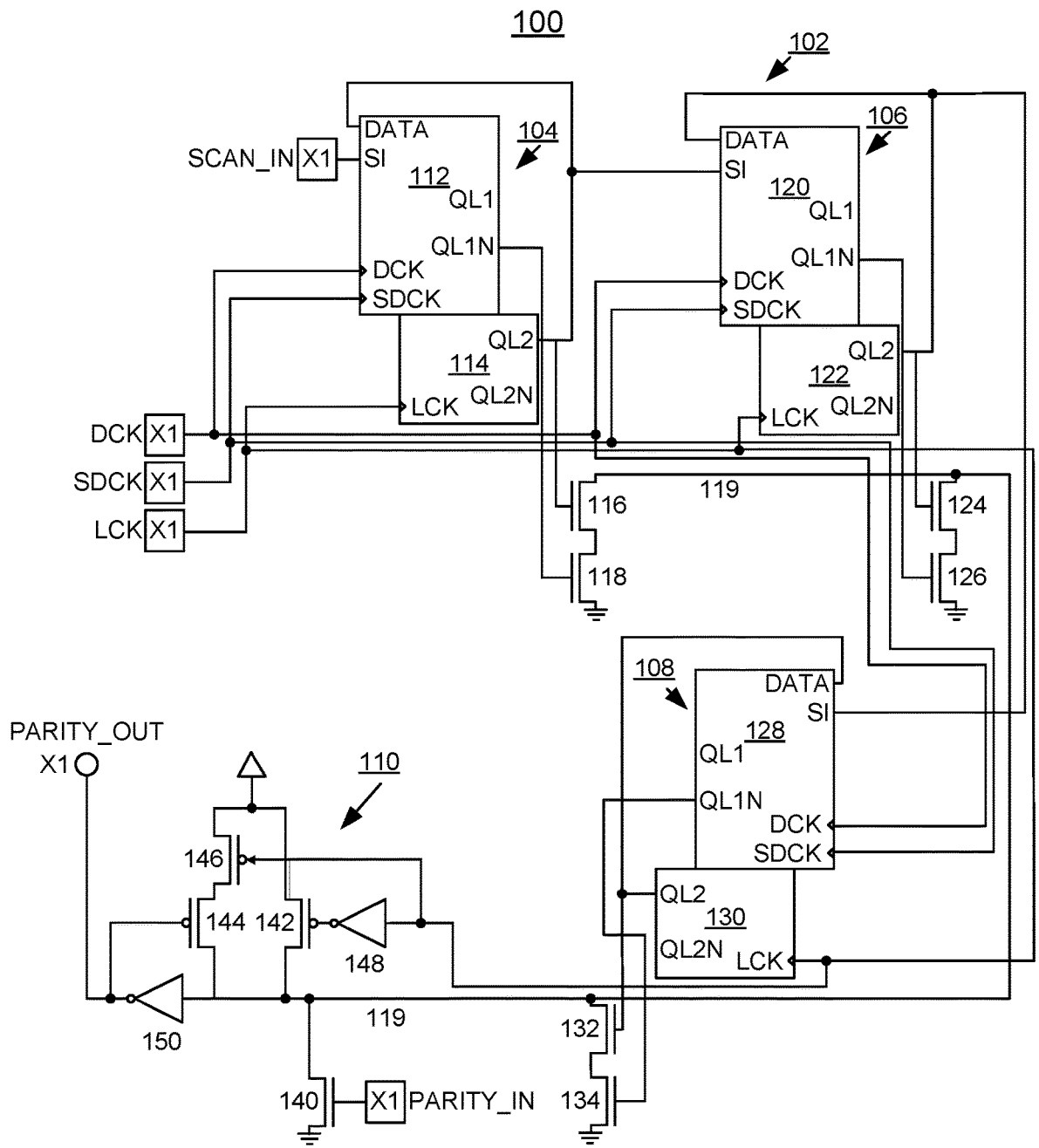
FIG. 1 is a schematic and block diagram representation of an example single event upset (SEU) parity detection circuit in accordance with preferred embodiments.

Having reference now to the drawings, in FIG. 1, there is shown an example single event upset (SEU) parity detection circuit generally designated by the reference character 100 in accordance with preferred embodiments.

In accordance with features of the invention, circuit 100 is designed for default-0 latches where a default state of a given latch is intended to be 0, and where circuit real-estate savings is desired.

Circuit 100 implements detection of unwanted state changes due to SEUs, noise or other event in a chain 102 of L1 L2 latches 104, 106, 108 having a default state of zero and coupled to a parity control circuit 110. Each latch includes an L1 latch and an L2 latch with the L2 latch having the connected output and is used and monitored for a flip. Latch 104 includes L1 latch 112 and L2 latch 114 with a pair of series-connected field effect transistors (FETs) 116, 118 connected between a drive input 119 of parity control circuit 110 and ground potential. A true output of the L2 latch 114 and an inverted output of the L1 latch 112 is applied to a respective gate of the pair of series-connected FETs 116, 118.

Latch 106 includes L1 latch 120 and L2 latch 122 with a pair of series-connected field effect transistors (FETs) 124, 126 connected between the drive input 119 of parity control circuit 110 and ground potential. A true output of the L2 latch 122 and an inverted output of the L1 latch 120 is applied to a respective gate of the pair of series-connected FETs 124, 126.

Latch 108 includes L1 latch 128 and L2 latch 130 with a pair of series-connected field effect transistors (FETs) 132, 134 connected between the drive input 119 of parity control circuit 110 and ground potential. A true output of the L2 latch 130 and an inverted output of the L1 latch 128 is applied to a respective gate of the pair of series-connected FETs 132, 134.

In accordance with features of the invention, the respective pair of series-connected field effect transistors (FETs) 116, 118; 124, 126; and 132, 134 are N-channel NFETs, and the parity control circuit 100 includes a P-channel PFET-based parity control circuit.

Parity control circuit 110 is a parity latch control circuit including a first PFET 140 receiving an input PARITY_IN and connected to PFETs 142 and 144 at the drive input 119 of parity control circuit 110. Parity latch control circuit include a PFET 146 connected in series with PFET 144 between the drive input 119 of parity control circuit 110 and a voltage supply rail, as shown. The L2 clock LCK is applied to the gate of PFET 146, and to the gate of PFET 142 via an inverter 148. An inverter 150 inverts and applies the drive input 119 of parity control circuit 110 to PFET 144 and provides the output of parity control circuit 110 at PARITY_OUT. An initial scan state "good" parity value is clocked into the initial parity latch 110.

In accordance with features of the invention, parity trigger L2 clock (LCK) is shared across each of the plurality of L1 L2 latches 104, 106, 108. An L1 Data and Scan clock (SDCK) are shared across each of the plurality of L1 L2 latches 104, 106, 108. An L2 flip from a SEU relative to the L1 state is detected by the resultant bias state of the NFET group 116, 118; 124, 126; and 132, 134 and compared to an initial parity input. On a mis-compare a parity failure is driven through parity out at PARITY_OUT.

In accordance with features of the invention, L1 Data can flip via SEU, with a periodically scrub provided to scrub the error out. Parity control latch circuit 110 and respective NFETs 116, 118; 124, 126; and 132, 134 for detection enable a net overall silicon space and complexity impact as compared with other conventional arrangements. The simplified parity detection circuit 100 provides enhanced unwanted state change detection due to SEUs with the net overall silicon space and complexity impact.

Figure 2:
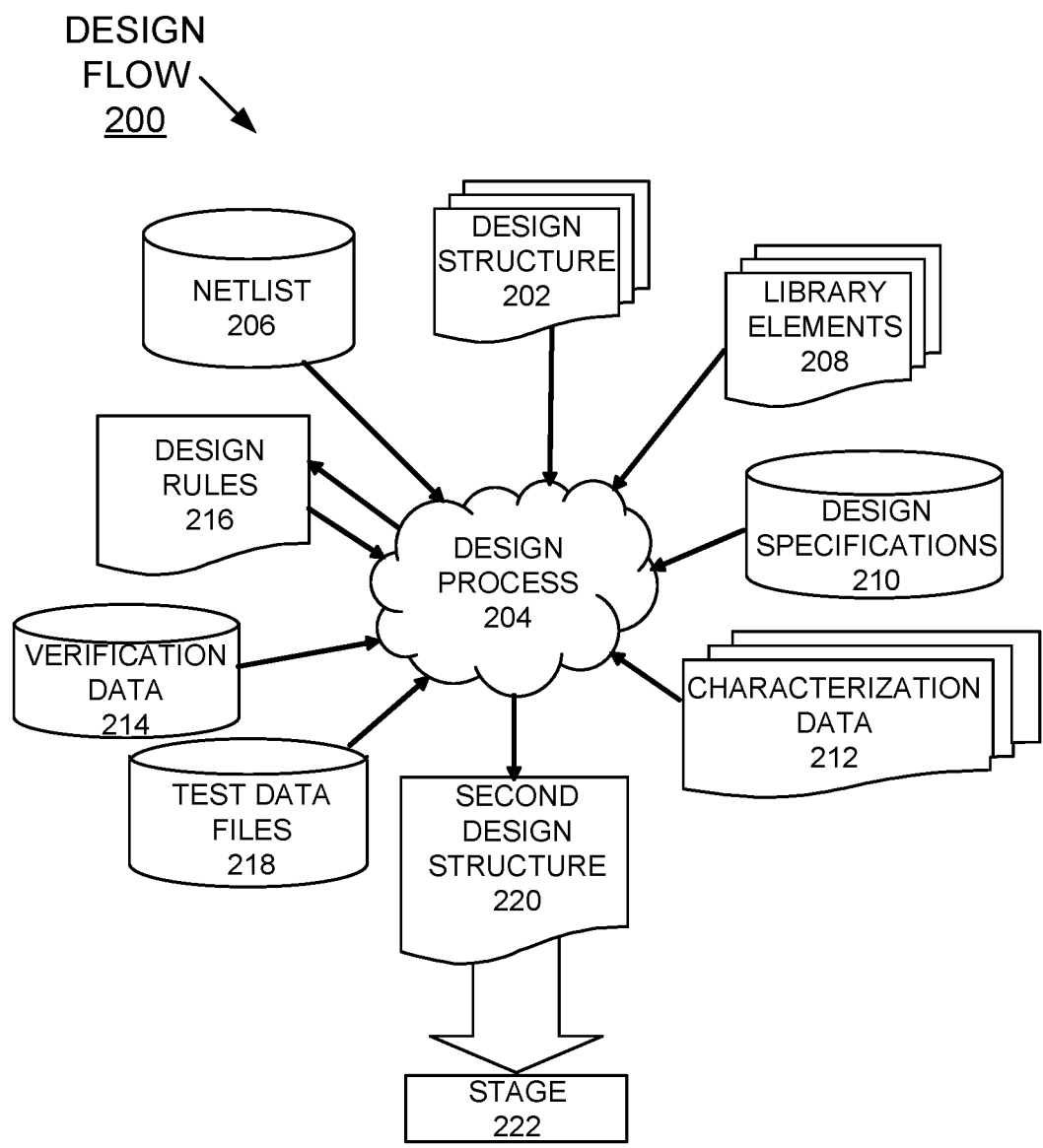
FIG. 2 is a flow diagram of a design process used in semiconductor design, manufacturing, and/or test.

FIG. 2 shows a block diagram of an example design flow 200. Design flow 200 may vary depending on the type of IC being designed. For example, a design flow 200 for building an application specific IC (ASIC) may differ from a design flow 200 for designing a standard component. Design structure 202 is preferably an input to a design process 204 and may come from an IP provider, a core developer, or other design company or may be generated by the operator of the design flow, or from other sources. Design structure 202 comprises circuit 100 in the form of schematics or HDL, a hardware-description language, for example, Verilog, VHDL, C, and the like. Design structure 202 may be contained on one or more machine readable medium. For example, design structure 202 may be a text file or a graphical representation of circuit 100. Design process 204 preferably synthesizes, or translates circuit 100 into a netlist 206, where netlist 206 is, for example, a list of wires, transistors, logic gates, control circuits, I/O, models, etc. that describes the connections to other elements and circuits in an integrated circuit design and recorded on at least one of machine readable medium. This may be an iterative process in which netlist 206 is resynthesized one or more times depending on design specifications and parameters for the circuits.

Design process 204 may include using a variety of inputs; for example, inputs from library elements 202 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 210, characterization data 212, verification data 214, design rules 216, and test data files 212, which may include test patterns and other testing information. Design process 204 may further include, for example, standard circuit design processes such as timing analysis, verification, design rule checking, place and route operations, and the like. One of ordinary skill in the art of integrated circuit design can appreciate the extent of possible electronic design automation tools and applications used in design process 204 without deviating from the scope and spirit of the invention. The design structure of the invention is not limited to any specific design flow.

Design process 204 preferably translates an embodiment of the invention as shown in FIG. 1 along with any additional integrated circuit design or data (if applicable), into a second design structure 220. Design structure 220 resides on a storage medium in a data format used for the exchange of layout data of integrated circuits, for example, information stored in a GDSII (GDS2), GL1, OASIS, or any other suitable format for storing such design structures. Design structure 220 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 220 may then proceed to a stage 222 where, for example, design structure 220 proceeds to tapeout, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing single event upset (SEU) parity detection comprising:
   an SEU parity detection circuit detecting unwanted state changes due to SEUs in a latch having a default state of zero;
   the latch including an L1 latch and an L2 latch with the L2 latch having the connected output and being used and monitored for a flip due to SEU;
   a pair of series-connected field effect transistors (FETs) connected between a drive input of a parity control circuit and ground potential and having a respective gate input applied by the L1 latch and the L2 latch; and
   an L2 clock applied to the L2 latch and the parity control circuit.

2. The circuit as recited in claim 1, wherein said pair of series-connected field effect transistors (FETs) detect unwanted state changes.

3. The circuit as recited in claim 1, wherein said pair of series-connected field effect transistors (FETs) are N-channel NFETs.

4. The circuit as recited in claim 3, wherein the parity control circuit includes a P-channel PFET-based parity control latch circuit.

5. The circuit as recited in claim 4, wherein the P-channel PFET-based parity control latch circuit includes a P-channel PFET-based parity latch circuit.

6. The circuit as recited in claim 4, includes an inverted output of the L1 latch and a true output of the L2 latch applied to a respective gate of the said pair of series-connected NFETs.

7. The circuit as recited in claim 5, includes a plurality of L1 L2 latches connected in a chain, each including said pair of series-connected field effect transistors (FETs).

8. The circuit as recited in claim 7, includes a L2 clock parity circuit trigger shared across each of the plurality of L1 L2 latches.

9. The circuit as recited in claim 7, includes an L1 Data and Scan clock are shared across each of the plurality of L1 L2 latches.

10. The circuit as recited in claim 7, includes L2 latch flip from a SEU relative to the L1 state detected by the resultant bias state of the group of said pair of series-connected NFETs and compared to an initial parity input.

11. The circuit as recited in claim 10, includes a miscompare indicating parity failure driven through to parity out of said P-channel PFET-based parity control circuit.

12. The circuit as recited in claim 10, includes a miscompare indicating parity failure at a parity output of said P-channel PFET-based parity control latch circuit.

13. A design structure embodied in a machine readable medium used in a design process, the design structure comprising:
a circuit tangibly embodied in the machine readable medium used in the design process, said circuit for implementing single event upset (SEU) parity detection, said a SEU parity detection circuit detecting unwanted state changes due to SEUs in a latch having a default state of zero; said SEU parity detection circuit comprising:
the latch including an L1 latch and an L2 latch with the L2 latch having the connected output and being used and monitored for a flip due to SEU;
a pair of series-connected field effect transistors (FETs) connected between a drive input of a parity control circuit and ground potential and having a respective gate input applied by the L1 latch and the L2 latch; and
an L2 clock applied to the L2 latch and the parity control circuit; wherein the design structure, when read and used in the manufacture of a semiconductor chip produces a chip comprising said SEU parity detection circuit.

14. The design structure of claim 13, wherein the design structure comprises a netlist, which describes said SEU parity detection circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, wherein said SEU parity detection circuit includes a plurality of L1 L2 latches connected in a chain, each including said pair of series-connected field effect transistors (FETs).

18. The design structure of claim 17, wherein said SEU parity detection circuit includes a L2 clock parity circuit trigger shared across each of the plurality of L1 L2 latches.

19. A method for implementing single event upset (SEU) parity detection comprising:
providing a single event upset (SEU) parity detection circuit for detecting unwanted state changes due to SEUs in a latch having a default state of zero;
providing the latch including an L1 latch and an L2 latch with the L2 latch having the connected output and being used and monitored for a flip due to SEU;
providing a pair of series-connected field effect transistors (FETs) connected between a drive input of a parity control circuit and ground potential and having a respective gate input applied by the L1 latch and the L2 latch;
applying an L2 clock to the L2 latch and the parity control circuit.

20. The method of claim 19, wherein said pair of series-connected field effect transistors (FETs) are N-channel NFETs and the parity control circuit includes a P-channel PFET-based parity control circuit.

\* \* \* \* \*